(12) United States Patent
Katsu et al.

(10) Patent No.: US 11,063,186 B2
(45) Date of Patent: Jul. 13, 2021

(54) METHOD FOR PRODUCING LIGHT WAVELENGTH CONVERSION MEMBER, LIGHT WAVELENGTH CONVERSION MEMBER, LIGHT WAVELENGTH CONVERSION COMPONENT AND LIGHT EMITTING DEVICE

(71) Applicant: NGK SPARK PLUG CO., LTD., Nagoya (JP)

(72) Inventors: Yusuke Katsu, Komaki (JP); Shohei Takaku, Komaki (JP); Tsuneyuki Ito, Aichi (JP); Takeshi Mitsuoka, Konan (JP); Jun Moteki, Seto (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 0 days.

(21) Appl. No.: 16/343,188

(22) PCT Filed: Oct. 24, 2017

(86) PCT No.: PCT/JP2017/038232
§ 371 (c)(1),
(2) Date: Apr. 18, 2019

(87) PCT Pub. No.: WO2018/079501
PCT Pub. Date: May 3, 2018

(65) Prior Publication Data
US 2019/0245119 A1 Aug. 8, 2019

(30) Foreign Application Priority Data

Oct. 28, 2016 (JP) .............................. JP2016-211843
Nov. 2, 2016 (JP) .............................. JP2016-215303
(Continued)

(51) Int. Cl.
*H01L 33/50* (2010.01)
*C04B 35/50* (2006.01)
(Continued)

(52) U.S. Cl.
CPC ............ *H01L 33/502* (2013.01); *B32B 7/027* (2019.01); *B32B 15/04* (2013.01); *C04B 35/117* (2013.01);
(Continued)

(58) Field of Classification Search
None
See application file for complete search history.

(56) References Cited

U.S. PATENT DOCUMENTS

2006/0124951 A1 6/2006 Sakata et al.
2008/0187746 A1 8/2008 De Graaf et al.
(Continued)

FOREIGN PATENT DOCUMENTS

EP 0 654 456 A1 5/1995
EP 1 209 137 A1 5/2002
(Continued)

OTHER PUBLICATIONS

Georgia State University: http://hyperphysics.phy-astr.gsu.edu/hbase/Tables/thrcn.html (Year: 2016).*
(Continued)

*Primary Examiner* — Frank J Vineis
*Assistant Examiner* — Nicole T Gugliotta
(74) *Attorney, Agent, or Firm* — Sughrue Mion, PLLC

(57) ABSTRACT

A method for producing an optical wavelength conversion member (9) composed of a sintered body containing, as main components, $Al_2O_3$ and a component represented by formula $A_3B_5O_{12}$:Ce; an optical wavelength conversion member; an optical wavelength conversion component including the optical wavelength conversion member; and a
(Continued)

US 11,063,186 B2

Page 2 light-emitting device including the optical wavelength conversion member or the optical wavelength conversion component. The production method of the sintered body includes firing in a firing atmosphere having a pressure of $10^4$ Pa or more and an oxygen concentration of 0.8 vol. % or more and less than 25 vol. %.

10 Claims, 4 Drawing Sheets

(30) Foreign Application Priority Data

| | | |
|---|---|---|
| Jan. 31, 2017 | (JP) | JP2017-015653 |
| May 19, 2017 | (JP) | JP2017-100204 |
| Oct. 12, 2017 | (JP) | JP2017-198556 |

(51) Int. Cl.

| | |
|---|---|
| G02B 5/20 | (2006.01) |
| C09K 11/08 | (2006.01) |
| H01L 33/48 | (2010.01) |
| B32B 15/04 | (2006.01) |
| C09K 11/77 | (2006.01) |
| C09K 11/02 | (2006.01) |
| C04B 35/117 | (2006.01) |
| C04B 35/44 | (2006.01) |
| C04B 35/645 | (2006.01) |
| B32B 7/027 | (2019.01) |

(52) U.S. Cl.
CPC ............. *C04B 35/44* (2013.01); *C04B 35/50* (2013.01); *C04B 35/645* (2013.01); *C09K 11/02* (2013.01); *C09K 11/08* (2013.01); *C09K 11/7774* (2013.01); *G02B 5/20* (2013.01); *H01L 33/483* (2013.01); *H01L 33/50* (2013.01); *H01L 33/505* (2013.01); *B32B 2307/302* (2013.01); *C04B 2235/3217* (2013.01); *C04B 2235/3222* (2013.01); *C04B 2235/6585* (2013.01); *H01L 2933/0041* (2013.01)

(56) References Cited

U.S. PATENT DOCUMENTS

| | | |
|---|---|---|
| 2011/0181173 A1 | 7/2011 | De Graaf et al. |
| 2012/0045634 A1 | 2/2012 | Irie et al. |
| 2012/0068213 A1 | 3/2012 | Zhang et al. |
| 2012/0305970 A1 | 12/2012 | Kim |
| 2013/0256599 A1 | 10/2013 | Irie |
| 2014/0080235 A1 | 3/2014 | Yajima et al. |
| 2015/0144978 A1 | 5/2015 | Miyagawa et al. |
| 2015/0219291 A1* | 8/2015 | Yamaguchi ........ C09K 11/7774 362/259 |
| 2015/0247618 A1 | 9/2015 | Irie |
| 2015/0329778 A1 | 11/2015 | Menke et al. |
| 2017/0088774 A1 | 3/2017 | Asai et al. |

FOREIGN PATENT DOCUMENTS

| | | |
|---|---|---|
| EP | 1 588 991 A1 | 10/2005 |
| EP | 1 760 794 A1 | 3/2007 |
| JP | 4609319 B2 | 1/2011 |
| JP | 5088977 B2 | 12/2012 |
| JP | 2013-209245 A | 10/2013 |
| JP | 5490407 B2 | 5/2014 |
| JP | 5650885 B2 | 1/2015 |
| JP | 5740017 B2 | 6/2015 |
| JP | 2016-509103 A | 3/2016 |
| JP | 2016-138034 A | 8/2016 |
| WO | 2015/141711 A1 | 9/2015 |

OTHER PUBLICATIONS

Liu et al., "The effect of the porosity on the Al2O3-YAG:Ce phosphor ceramic: Microstructure, luminescent efficiency, and luminous stability in laser-driven lighting", Journal of Alloys and Compounds, vol. 785, May 2019, pp. 125-130. (Year: 2019).*
Search Report dated Jan. 30, 2018, issued by the International Searching Authority in International Application No. PCT/JP2017/038232 (PCT/ISA/210).
Communication dated Jul. 25, 2018, issued by the Taiwanese Patent Office in counterpart Taiwan Application No. 106137051.
Communication dated Jul. 14, 2020 from the European Patent Office in application No. 17865459.6.
Communication dated Apr. 14, 2020 issued by the European Intellectual Property Office in counterpart European Application No. 17865459.6.
Parthasarathy et al., "Deformation Behavior of an $Al_2O_3$—$Y_3Al_5O_{12}$ Eutectic Composite in Comparison with Sapphire and YAG", Journal of the American Ceramic Society, vol. 76, No. 1, Jan. 1, 1993, pp. 29-32, 4 pp. total, XP002993333.
Communication dated Dec. 17, 2020 issued by the European Intellectual Property Office in counterpart European Application No. 17 865 459.6.

* cited by examiner

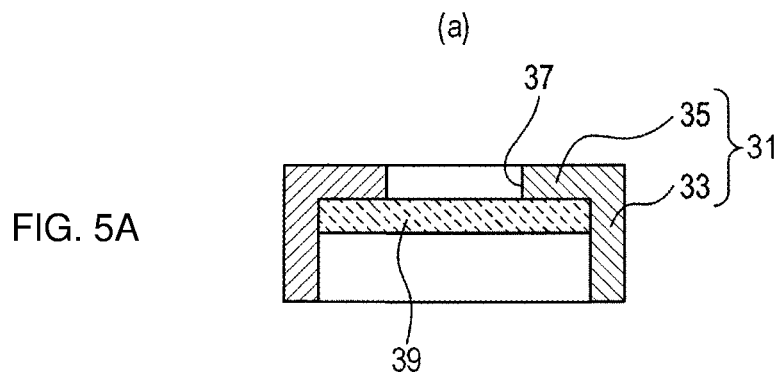
FIG. 5A
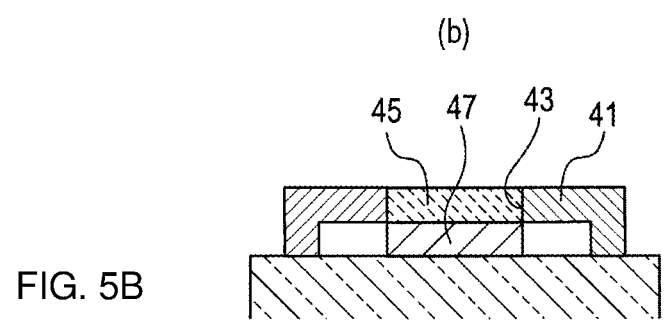
FIG. 5B
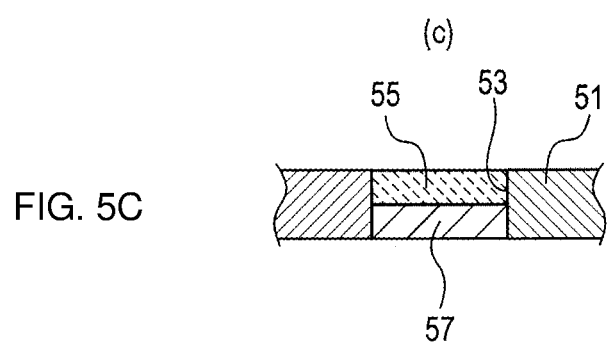
FIG. 5C
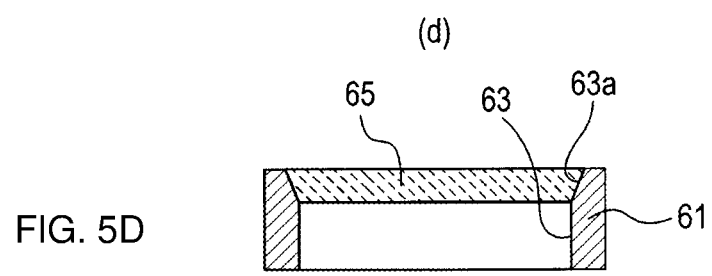
FIG. 5D
FIG. 5

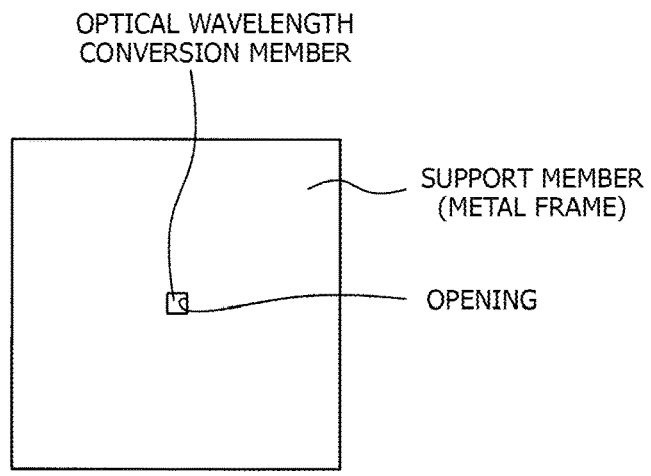
FIG. 6
(a)
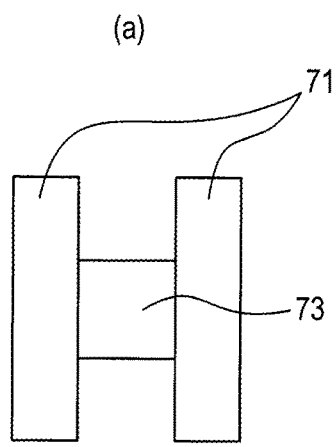
FIG. 7A
(b)
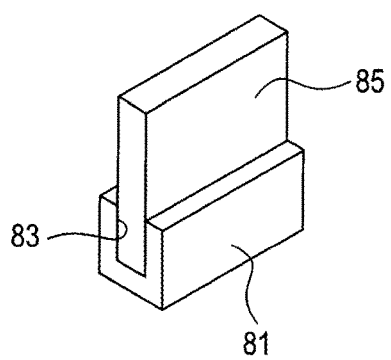
FIG. 7B
FIG. 7

METHOD FOR PRODUCING LIGHT WAVELENGTH CONVERSION MEMBER, LIGHT WAVELENGTH CONVERSION MEMBER, LIGHT WAVELENGTH CONVERSION COMPONENT AND LIGHT EMITTING DEVICE

CROSS REFERENCE TO RELATED APPLICATIONS

This application is a National Stage of International Application No. PCT/JP2017/038232, filed Oct. 24, 2017, claiming priority based on Japanese Patent Application Nos. 2016-211843, filed Oct. 28, 2016, 2016-215303 filed Nov. 2, 2016, 2017-015653 filed Jan. 31, 2017, 2017-100204 filed May 19, 2017 and 2017-198556 filed Oct. 12, 2017.

TECHNICAL FIELD

The present invention relates to a method for producing an optical wavelength conversion member capable of converting light wavelength and used for, for example, head lamps, lighting apparatuses, and optical apparatuses (e.g., projectors). The present invention also relates to an optical wavelength conversion member, an optical wavelength conversion component including the optical wavelength conversion member, and a light-emitting device including the optical wavelength conversion member or the optical wavelength conversion component.

BACKGROUND ART

For example, a head lamp or a lighting apparatus generally includes a device for achieving white light through wavelength conversion, with a phosphor, of blue light emitted from a light-emitting diode (LED) or a laser diode (LD).

Hitherto, the matrix or material of the phosphor (or a fluorescent body) is, for example, a resin material or a glass material. In a trend for using a high-output light source in recent years, the phosphor is required to have higher durability. Thus, ceramic phosphors have received attention (see Patent Documents 1 to 3).

Meanwhile, known ceramic phosphors are formed of a Ce-activated garnet ($A_3B_5O_{12}$) component, such as $Y_3Al_5O_{12}$:Ce (YAG:Ce).

For example, the techniques disclosed in Patent Documents 1 to 3 involve formation of an $Al_2O_3$-YAG:Ce composite material exhibiting improved thermal resistance and thermal conductivity. The $Al_2O_3$-containing composite material formed through such a technique has thermal conductivity higher than that of a single YAG:Ce component, and thus exhibits improved thermal resistance and laser power resistance.

The characteristic features of the techniques disclosed in Patent Documents 1 to 3 will now be briefly described.

The technique disclosed in Patent Document 1 involves formation of a sintered body (i.e., a phosphor) by means of unidirectional solidification. The sintered body has a composition of $Al_2O_3$/YAG:Ce (=55/45 by volume). The sintered body exhibits limited fluorescent properties (e.g., fluorescence intensity and color uniformity (no variation in color)).

The technique disclosed in Patent Document 2 involves $CeAl_{11}O_{18}$ segregation in a crystal in the course of production of a sintered body for preventing color unevenness due to uneven Ce concentration caused by Ce evaporation during firing. Since $CeAl_{11}O_{18}$ itself does not have fluorescent properties, the presence of the substance may cause loss of the fluorescent properties of the entire sintered body.

The technique disclosed in Patent Document 3 involves melting of inorganic powder by a spark plasma sintering (SPS) process and subsequent cooling of the molten product, thereby producing a sintered body. The SPS process involves application of pulsed large current to a mixture of phosphor powder and inorganic powder at low voltage, thereby melting the inorganic powder by means of high energy of discharge plasma instantly generated through a spark discharge phenomenon.

PRIOR ART DOCUMENT

Patent Document

Patent Document 1: Japanese Patent No. 4609319
Patent Document 2: Japanese Patent No. 5740017
Patent Document 3: Japanese Patent No. 5650885

SUMMARY OF THE INVENTION

Problem to be Solved by the Invention

The aforementioned conventional techniques have problems described below, and the problems are required to be solved.

Specifically, the technique disclosed in, for example, Patent Document 2 or 3 involves a vacuum firing process, an SPS process, or a hot isostatic pressing (HIP) process for the production of a sintered body. In the case where the vacuum firing process, the SPS process, or the HIP process is performed, a carbonaceous material is generally used as a heat source, an adiabatic material, or a firing vessel.

Such a carbonaceous material may be vaporized at a specific concentration during firing, and the vaporized carbon may float and infiltrate into a sintered body, resulting in blackening of the sintered body. The vaporized carbon may react with a small amount of oxygen released from the sintered body to generate carbon monoxide, and the furnace may be filled with a reducing atmosphere. This may cause chemical reduction of the sintered body and generation of oxygen defects, resulting in a color change of the sintered body from dark gray to black.

Thus, even in the case where the sintered body is densified, when the color of the sintered body changes to black, the sintered body necessarily exhibits very poor fluorescent properties. This causes problems when a high-output laser diode (LD) is used as a light source for blue light.

In view of the foregoing, an object of the present invention is to provide a method for producing an optical wavelength conversion member, the method being capable of readily reducing blackening of the optical wavelength conversion member; an optical wavelength conversion member with suppressed blackening; an optical wavelength conversion component including the optical wavelength conversion member; and a light-emitting device including the optical wavelength conversion member or the optical wavelength conversion component.

Means for Solving the Problem (1) In a first aspect of the present invention, there is provided a method for producing an optical wavelength conversion member comprising a sintered body containing, as main components, $Al_2O_3$ and a component represented by formula $A_3B_5O_{12}$:Ce (wherein A and B are elements).

In the optical wavelength conversion member production method, the sintered body is produced through firing in a firing atmosphere having a pressure of $10^4$ Pa or more and an oxygen concentration of 0.8 vol. % or more and less than 25 vol. %.

In the first aspect, the firing is performed in a firing atmosphere having a pressure of $10^4$ Pa or more (e.g., $10^5$ Pa or less) and an oxygen concentration of 0.8 vol. % or more and less than 25 vol. 5. Thus, as shown in the Examples hereinbelow, the blackening of the sintered body is prevented in the furnace atmosphere, and the sintered body exhibits superior fluorescent properties.

Therefore, the optical wavelength conversion member produced by the production method exhibits high fluorescence intensity and achieves high color uniformity. Thus, the production method can advantageously produce an optical wavelength conversion member exhibiting superior fluorescent properties in the presence of a high-output LED or laser light source.

In order to prevent pores from remaining in the sintered body structure, the firing atmosphere preferably has a pressure of $10^6$ Pa or less. The firing may be performed by means of a hydrogen furnace in a similar firing atmosphere prepared by use of a wetter. In such a case, the temperature of the wetter is preferably 0 to 40° C.

(2) A second aspect is directed to a specific embodiment of the optical wavelength conversion member production method, wherein the sintered body has an $A_3B_5O_{12}$:Ce content of 3 to 70 vol. %, and the $A_3B_5O_{12}$:Ce is composed of polycrystalline grains formed through eutectic segregation in $Al_2O_3$ during the firing.

The $A_3B_5O_{12}$:Ce is composed of polycrystalline grains formed through eutectic segregation in $Al_2O_3$ (i.e., $Al_2O_3$ crystal grains) by firing, for example, a compound of A (A compound), a compound of B (B compound), and a compound of Ce (Ce compound).

In order to enhance the emission efficiency of the optical wavelength conversion member, which is a light-emitting member (specifically, a fluorescent member), the thickness of the member may be decreased for increasing the amount of transmission of excitation light or wavelength-converted light, or the amount of the $A_3B_5O_{12}$:Ce may be increased for increasing the amount of light to be wavelength-converted. However, an excessive increase in amount of the $A_3B_5O_{12}$:Ce may cause problems in that, for example, the fluorescent member exhibits low thermal conductivity and is likely to have low mechanical strength.

An excessive decrease in amount of the $A_3B_5O_{12}$:Ce may lead to difficulty in achieving satisfactory emission of light.

Thus, the amount of the $A_3B_5O_{12}$:Ce is preferably 3 to 70 vol. % relative to the entire sintered body.

The $A_3B_5O_{12}$:Ce polycrystalline grains are preferably formed through eutectic segregation in $Al_2O_3$ by firing the A compound, the B compound, and the Ce compound, since a dense fluorescent member is difficult to prepare only by compounding of $Al_2O_3$ crystal grains and $A_3B_5O_{12}$:Ce crystal grains.

(3) A third aspect is directed to a specific embodiment of the optical wavelength conversion member production method, wherein the sintered body has a garnet structure represented by $A_3B_5O_{12}$:Ce, wherein each of A and B is at least one element selected from the following element groups:

A: Sc, Y, and lanthanoids (except for Ce), and
B: Al and Ga.

The composition according to the third aspect enables effective conversion of blue light into visible light.

(4) A fourth aspect is directed to a specific embodiment of the optical wavelength conversion member production method, wherein the Ce content of the $A_3B_5O_{12}$:Ce is 5 mol % or less (exclusive of 0) relative to the element A.

The Ce content falling within a range according to the fourth aspect achieves satisfactory fluorescent properties. When the Ce content (Ce concentration) exceeds 5 mol %, concentration quenching is likely to occur, resulting in low fluorescence intensity. When the Ce content is less than 0.1 mol %, a satisfactory fluorescent intensity is difficult to achieve. Thus, the Ce content is preferably 0.1 mol % or more.

(5) In a fifth aspect of the present invention, there is provided an optical wavelength conversion member comprising a sintered body containing, as main components, $Al_2O_3$ and a component represented by formula $A_3B_5O_{12}$:Ce (wherein A and B are elements).

The optical wavelength conversion member is characterized in that: the sintered body exhibits a relative concentration ratio (Cout/Alout)/(Cin/Alin) of 2 or less, wherein (Cin/Alin) represents the ratio of the number of C atoms (Cin) to the number of Al atoms (Alin) in a cross section at a center portion of the sintered body, and (Cout/Alout) represents the ratio of the number of C atoms (Cout) to the number of Al atoms (About) in a cross section at an end portion of the sintered body.

The optical wavelength conversion member (i.e., sintered body) according to the fifth aspect exhibits superior fluorescent properties, since the relative concentration ratio falls within the aforementioned range, and thus blackening is suppressed as shown in the Examples hereinbelow.

Since blackening of the sintered body is suppressed in the furnace atmosphere during production of the sintered body, superior fluorescent properties are achieved.

As used herein, the term "end portion of the sintered body" refers to a region within 1 mm from the circumference of the sintered body, and the term "center portion of the sintered body" refers to "portion inside the end portion of the sintered body (e.g., the center of gravity in a cross section)."

When the cross section is a plane including a region having a radius of 1.5 mm or less from the center of gravity of the sintered body, the region having a radius of 1.5 mm or less (including the center of gravity) can be defined as a center portion of the sintered body. The cross section is determined such that a center portion is located 5 mm or more away from a region of the end portion of the cross section.

The composition of the sintered body in the cross section can be analyzed by means of, for example, XPS (X-ray photoelectron spectroscopy) or ESCA (electron spectroscopy for chemical analysis).

When a plurality of measurements are obtained at the center portion or the end portion through the analysis performed a plurality of times (e.g., the analysis is performed a plurality of times at the same position or different positions in a region of the center portion or the end portion), the average of the resultant measurements can be used.

The optical wavelength conversion member can be produced by any of the production methods according to the aforementioned first to fourth aspects.

(6) In a sixth aspect of the present invention, there is provided an optical wavelength conversion component characterized by comprising an optical wavelength conversion member as recited in the fifth aspect, and a support member which is made of a metal and supports the optical wavelength conversion member, wherein the support member has a thermal conductivity higher than the thermal conductivity of the optical wavelength conversion member.

In general, an optical wavelength conversion member receives light from a light source (e.g., LED or LD) and converts the wavelength of the light. The light incident on the optical wavelength conversion member increases the temperature thereof. An increase in temperature of the optical wavelength conversion member results in low emission intensity (i.e., low fluorescence intensity) due to temperature quenching.

In contrast, according to the sixth aspect, the optical wavelength conversion member is supported by the metal-made support member having a thermal conductivity higher than that of the optical wavelength conversion member. Thus, the heat of the optical wavelength conversion member is rapidly transferred to the support member having high thermal conductivity. Consequently, the temperature of the optical wavelength conversion member decreases, and temperature quenching is prevented. Therefore, a reduction in fluorescence intensity can be prevented as compared with the case where the support member is not used.

The relationship in thermal conductivity (thermal conduction coefficient) between the optical wavelength conversion member and the support member is preferably satisfied over the entire temperature range. The relationship should be satisfied at least within a temperature range in which the optical wavelength conversion component is used (e.g., −20 to 300° C.).

(7) In a seventh aspect of the present invention, the support member is formed of a frame body, and the optical wavelength conversion member is fixed in the frame body.

The seventh aspect corresponds to a preferred configuration of the optical wavelength conversion component. With this configuration, even when the temperature of the optical wavelength conversion member increases, the heat thereof can be effectively released via the metal-made support member. The optical wavelength conversion member can be reliably supported by the frame-shaped support member.

In an eighth aspect of the present invention, there is provided a light-emitting device characterized by comprising an optical wavelength conversion member as recited in the fifth aspect or an optical wavelength conversion component as recited in the sixth or seventh aspect.

The light (i.e., fluorescence) having a wavelength converted by means of the light-emitting device (specifically, the optical wavelength conversion member) according to the eighth aspect exhibits high fluorescence intensity and high color uniformity.

The light-emitting device may include any known light-emitting element, such as LED or LD.

<Characteristic Features of the Present Invention Will Now be Described>

The aforementioned "optical wavelength conversion member" is formed of a ceramic sintered body having the aforementioned characteristics. Crystal grains or the grain boundary therebetween may contain an unavoidable impurity.

The term "main components" described above refers to any component present in a predominant amount (volume) in the optical wavelength conversion member.

The term "$A_3B_5O_{12}$:Ce" described above refers to the case where a portion of the element A contained in $A_3B_5O_{12}$ is substituted by Ce through formation of a solid solution. The compound having such a structure exhibits fluorescent properties.

Examples of the aforementioned metal include elemental metals, such as copper, aluminum, nickel, and iron; and alloys, such as Cu—W, Cu—Mo, brass, aluminum alloy, and stainless steel.

The metal-made support member may contain a non-metal component in a small amount (e.g., 30 vol. % or less), so long as the non-metal component does not impair the aforementioned relationship in thermal conductivity between the support member and the optical wavelength conversion member, the heat exchange resulting from light absorption by the optical wavelength conversion member does not affect emission property, and the non-metal component does not affect the optical reflectance of the support member at the interface between the support member and the optical wavelength conversion member.

BRIEF DESCRIPTION OF THE DRAWINGS

FIGS. 5A to 5D are cross-sectional views (in a thickness direction) of, for example, an optical wavelength conversion component according to a modification.

FIG. 6 is a plan view of an optical wavelength conversion component (sample No. 31) of Example 7.

FIG. 7A is a plan view of an optical wavelength conversion component according to another embodiment. FIG. 7B is a perspective view of an optical wavelength conversion component according to still another embodiment.

MODES FOR CARRYING OUT THE INVENTION

Next will be described embodiments of the production method for an optical wavelength conversion member, the optical wavelength conversion member, the optical wavelength conversion component, and the light-emitting device of the present invention.

1. First Embodiment

[1-1. Light-Emitting Device]

Now will be described a light-emitting device including an optical wavelength conversion member according to the first embodiment.

Figure 1:
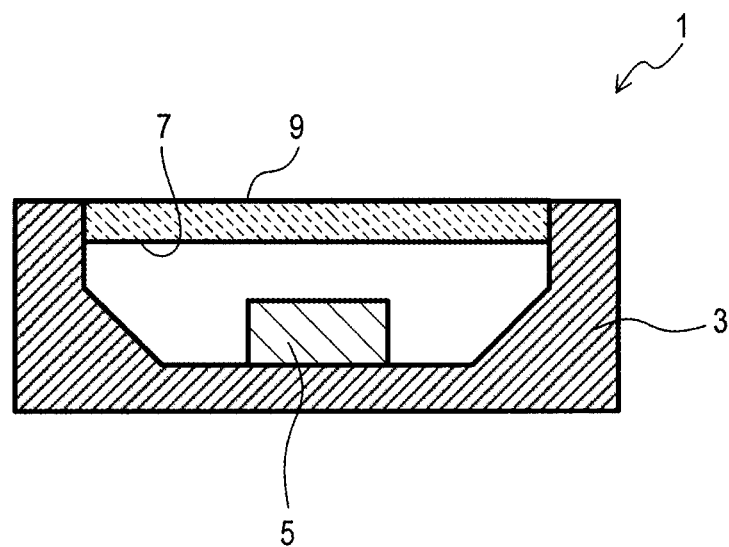
FIG. 1 is a cross-sectional view (in a thickness direction) of a light-emitting device including an optical wavelength conversion member according to a first embodiment.

As illustrated in FIG. 1, a light-emitting device 1 of the first embodiment includes a box-shaped ceramic package (container) 3 formed of, for example, alumina; a light-emitting element 5 (e.g., LD) disposed in the interior of the container 3; and a plate-like optical wavelength conversion member 9 disposed so as to cover an opening 7 of the container 3.

In the light-emitting device 1, light emitted from the light-emitting element 5 transmits through the translucent optical wavelength conversion member 9, and the wavelength of a portion of the emitted light is converted in the interior of the optical wavelength conversion member 9.

Thus, the optical wavelength conversion member 9 emits fluorescence having a wavelength different from that of the light emitted from the light-emitting element 5.

For example, the optical wavelength conversion member 9 converts the wavelength of blue light emitted from an LD, whereby the optical wavelength conversion member 9 as a whole emits white light to the outside (e.g., upward in FIG. 1).

[1-2. Optical Wavelength Conversion Member]

The optical wavelength conversion member 9 will now be described.

The optical wavelength conversion member 9 of the first embodiment is formed of a ceramic sintered body formed of a polycrystalline body containing, as main components, $Al_2O_3$ crystal grains and crystal grains of a component represented by formula $A_3B_5O_{12}$:Ce (i.e., $A_3B_5O_{12}$:Ce crystal grains).

A and B of formula $A_3B_5O_{12}$:Ce correspond to elements (note: different elements) forming a substance represented by formula $A_3B_5O_{12}$:Ce, wherein O is oxygen and Ce is cerium.

In the optical wavelength conversion member 9, the $A_3B_5O_{12}$:Ce content of the entire ceramic sintered body is 3 to 70 vol. %. The $A_3B_5O_{12}$:Ce is composed of polycrystalline grains formed through eutectic segregation in $Al_2O_3$ during firing.

The ceramic sintered body has a garnet structure represented by $A_3B_5O_{12}$:Ce, wherein each of A and B is at least one element selected from the following element groups:

A: Sc, Y, and lanthanoids (except for Ce), and
B: Al and Ga.

In the ceramic sintered body, the Ce content of the $A_3B_5O_{12}$:Ce is 5 mol % or less (exclusive of 0) relative to the element A.

The sintered body exhibits a ratio (Cout/Alout)/(Cin/Alin) of 2 or less, wherein (Cin/Alin) represents the ratio of the number of C (carbon) atoms (Cin) to the number of Al (aluminum) atoms (Alin) in a cross section at a center portion of the sintered body (hereinafter the ratio (Cin/Alin) may be referred to as "inside ratio"), and (Cout/Alout) represents the ratio of the number of C atoms (Cout) to the number of Al atoms (About) in a cross section at an end portion of the sintered body (hereinafter the ratio (Cout/Alout) may be referred to as "outside ratio").

[1-3. Production Method for Optical Wavelength Conversion Member]

A schematic production process for the optical wavelength conversion member 9 will now be briefly described.

Figure 2:
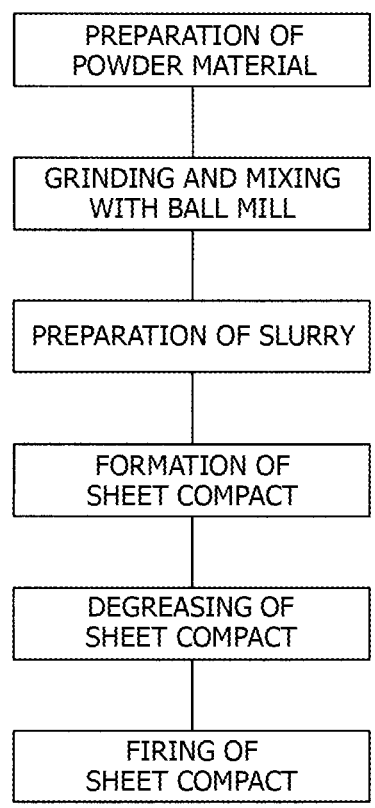
FIG. 2 is an explanatory view showing a production process for the optical wavelength conversion member according to the first embodiment.

As illustrated in FIG. 2, powder materials for the optical wavelength conversion member 9 (i.e., ceramic sintered body) were weighed so as to satisfy the aforementioned requirement of the first embodiment (i.e., the powder materials were prepared).

Subsequently, an organic solvent and a dispersant were added to the prepared powder materials, and these materials were ground and mixed in a ball mill.

Subsequently, the powder prepared through grind-mixing was mixed with a resin, to thereby prepare a slurry.

The slurry was then formed into a sheet compact by means of doctor blading.

The sheet compact was then degreased.

The degreased sheet compact was fired in a firing atmosphere having a pressure of $10^4$ Pa or more and an oxygen concentration of 0.8 vol. % or more and less than 25 vol. % for a predetermined period of time. The ceramic sintered body was thereby produced.

[1-4. Effects]

The effects of the first embodiment will now be described.

(1) In the first embodiment, the optical wavelength conversion member 9 (i.e., sintered body) is produced through firing in a firing atmosphere having a pressure of $10^4$ Pa or more and an oxygen concentration of 0.8 vol. % or more and less than 25 vol. %. Thus, the blackening of the sintered body is prevented in the furnace atmosphere, and the sintered body exhibits superior fluorescent properties.

Therefore, the optical wavelength conversion member 9 produced by the production method exhibits high fluorescence intensity and achieves high color uniformity. Thus, the production method can advantageously produce the optical wavelength conversion member 9 exhibiting superior fluorescent properties in the presence of a high-output LED or laser light source.

(2) In the first embodiment, the $A_3B_5O_{12}$:Ce content of the entire sintered body is 3 to 70 vol. %, and the $A_3B_5O_{12}$:Ce is composed of polycrystalline grains formed through eutectic segregation in $Al_2O_3$ during firing.

In order to enhance the emission efficiency of the optical wavelength conversion member 9, the thickness of the member may be decreased for increasing the amount of transmission of excitation light or wavelength-converted light, or the amount of the $A_3B_5O_{12}$:Ce may be increased for increasing the amount of light to be wavelength-converted. However, an excessive increase in amount of the $A_3B_5O_{12}$:Ce may cause problems in that, for example, the optical wavelength conversion member 9 exhibits low thermal conductivity and is likely to have low mechanical strength. An excessive decrease in amount of the $A_3B_4O_{12}$: Ce may lead to difficulty in achieving satisfactory emission of light. Thus, the amount of the $A_3B_5O_{12}$:Ce is preferably 3 to 70 vol. %.

(3) In the first embodiment, the sintered body has a garnet structure represented by $A_3B_5O_{12}$:Ce, wherein each of A and B is at least one element selected from the following element groups:

A: Sc, Y, and lanthanoids (except for Ce), and
B: Al and Ga.

This composition enables effective conversion of blue light into visible light.

(4) In the first embodiment, in the sintered body, the Ce content of the $A_3B_5O_{12}$:Ce is 5 mol % or less (exclusive of 0) relative to the element A.

When the Ce content falls within this range, the sintered body exhibits satisfactory fluorescent properties. When the Ce content exceeds 5 mol %, concentration quenching is likely to occur, resulting in low fluorescence intensity. Thus, this range of Ce content is preferred.

(5) In the first embodiment, the optical wavelength conversion member 9 exhibits a relative concentration ratio (Cout/Alout)/(Cin/Alin) of 2 or less, wherein (Cin/Alin) represents the ratio (inside ratio) of the number of C (carbon) atoms (Cin) to the number of Al atoms (Alin) in a cross section at a center portion of the sintered body, and (Cout/Alout) represents the ratio (outside ratio) of the number of C atoms (Cout) to the number of Al atoms (About) in a cross section at an end portion of the sintered body.

When the relative concentration ratio falls within this range, blackening is suppressed, and thus as superior fluorescent properties are achieved.

(6) The light (i.e., fluorescence) having a wavelength converted by means of the light-emitting device 1 (specifically, the optical wavelength conversion member 9) of the first embodiment exhibits high fluorescence intensity. The light also exhibits high color uniformity.

2. Second Embodiment

The second embodiment will now be described. Description of the same components as those in the first embodiment is omitted or simplified.

[2-1. Configuration]

Figure 3:
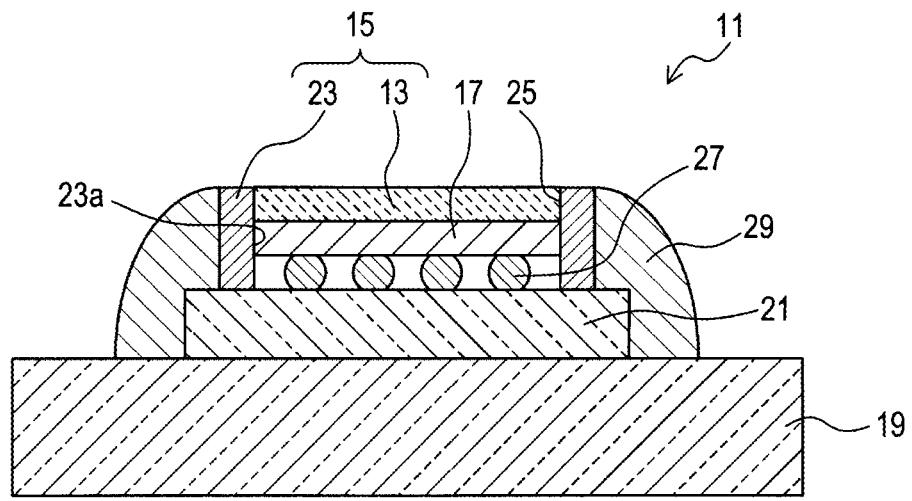
FIG. 3 is a schematic cross-sectional view (in a thickness direction) of a light-emitting device including an optical wavelength conversion component according to a second embodiment.

As schematically illustrated in FIG. 3, a light-emitting device 11 of the second embodiment includes, for example, an optical wavelength conversion component 15 in which an optical wavelength conversion member 13 having the same structure as in the first embodiment is supported, a light-emitting element 17 (e.g., LD), and substrates (i.e., wiring substrates) 19 and 21.

Specifically, the second substrate 21 is disposed on the first substrate 19, and the optical wavelength conversion component 15 is disposed on the second substrate 21.

The optical wavelength conversion component 15 includes the optical wavelength conversion member 13, and a support member 23 which supports the optical wavelength conversion member 13.

As in the case of the first embodiment, the optical wavelength conversion member 13 is a plate member having, for example, a quadrangular shape (rectangular shape in this embodiment) in plan view (as viewed from above in FIG. 3). The optical wavelength conversion member 13 has dimensions of, for example, 1.5 mm (width)×6.0 mm (length)×0.2 mm (thickness).

Figure 4:
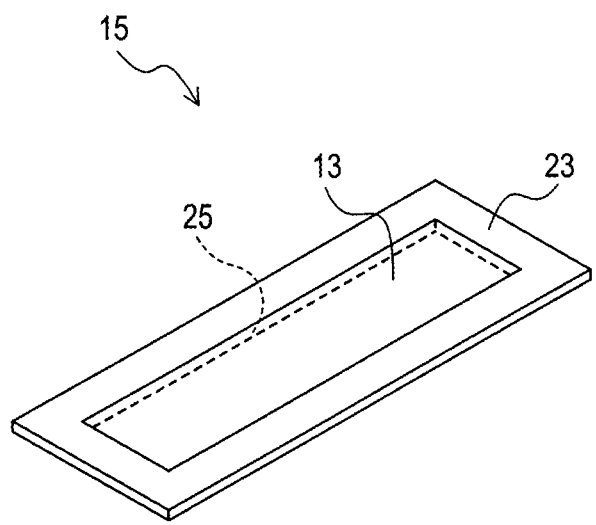
FIG. 4 is a perspective view of the optical wavelength conversion component according to the second embodiment.

The support member 23 is a metal-made frame body having, for example, a quadrangular shape (rectangular shape in this embodiment) in plan view. The frame body has, in its inside, a through hole 25 which is coaxial with the support member 23 and into which the optical wavelength conversion member 13 is fitted. The through hole 25 has, for example, quadrangular shape (rectangular shape in this embodiment) in plan view (see FIG. 4).

The support member 23 is made of a metal material (e.g., elemental metal or alloy) having thermal conductivity higher than that of the optical wavelength conversion member 13. Examples of the metal material include copper, aluminum, nickel, iron, and alloys thereof (e.g., stainless steel).

The support member 23 has dimensions (i.e., outer dimensions thereof) of, for example, 2.7 mm (width)×7.2 mm (length)×0.6 mm (thickness). The through hole 25 has dimensions (i.e., inner dimensions of the support member 23) of, for example, 1.49 mm (width)×5.99 mm (length)×0.6 mm (thickness).

The shape and size (in plan view) of the through hole 25 are substantially consistent with those of the optical wavelength conversion member 13. Thus, the optical wavelength conversion member 13 can be fixed to the support member 23 through thermal press fitting of the optical wavelength conversion member 13 into the through hole 25 of the support member 23.

The light-emitting element 17 is disposed in the frame of the support member 23 (i.e., in the through hole 25) so as to be located inside (downward in FIG. 3) of the optical wavelength conversion member 13. The light-emitting element 17 is connected to the wiring (not illustrated) of the second substrate 21 by means of a connection portion 27 (e.g., solder bumps).

The support member 23 is connected to and integrated with the substrates 19 and 21 by means of a resin 29 provided on the outer peripheral side of the support member 23.

In the light-emitting device 1, similar to the first embodiment, light emitted from the light-emitting element 17 transmits through the translucent optical wavelength conversion member 13, and the wavelength of a portion of the emitted light is converted in the interior of the optical wavelength conversion member 13.

Light emitted through the side surfaces of the light-emitting element 17 is reflected at the inner peripheral surface 23a of the support member 23. Finally, the reflected light is introduced into the optical wavelength conversion member 13, and the wavelength of the light is converted in the same manner as described above. The inner peripheral surface 23a of the support member 23 may be provided with a reflective film (not illustrated) formed through, for example, silver plating for increasing light reflectance.

The optical wavelength conversion member 13 converts the wavelength of, for example, blue light emitted from the light-emitting element 17, whereby the optical wavelength conversion member 13 as a whole emits white light to the outside (e.g., upward in FIG. 3).

[2-2. Production Method]

Now will be described a method for producing the optical wavelength conversion component 15, which is an essential of the second embodiment.

As in the case of the first embodiment, the optical wavelength conversion member 13 is produced so as to have the aforementioned dimensions.

The support member 23 (i.e., frame body) is produced through cutting of, for example, a stainless steel plate so as to have the aforementioned dimensions.

Subsequently, the support member 23 and the optical wavelength conversion member 13 are heated at, for example, 300° C. or higher so that the optical wavelength conversion member 13 can be inserted into the through hole 25 of the support member 23, and then the optical wavelength conversion member 13 is thermally press-fitted into the through hole 25 of the support member 23. Thus, the optical wavelength conversion component 15 can be produced.

The optical wavelength conversion member 13 can be fixed to the support member 23 by any process other than the aforementioned thermal press fitting process.

Examples of the process include a press fitting process, a crimping process (e.g., thermal crimping), a bonding process by use of a metal (e.g., Ag) paste, and an alloying and bonding process. Use of an inorganic adhesive is not preferred, since the inorganic adhesive causes a reduction in thermal conductivity or light reflectance at the interface between the support member 23 and the optical wavelength conversion member 13.

There can be used any process which can fix the optical wavelength conversion member 13 (i.e., sintered body) to the metal-made support member 23.

[2-3. Effects]

The second embodiment achieves the same effects as in the first embodiment.

In the second embodiment, the optical wavelength conversion member 13 is supported by the metal-made support member 23 having a thermal conductivity higher than that of the optical wavelength conversion member 13. Thus, even when the temperature of the optical wavelength conversion member 13 increases, the heat of the interior of the optical wavelength conversion member 13 is rapidly transferred to the support member 23 having high thermal conductivity. Consequently, the temperature of the optical wavelength conversion member 13 decreases, and temperature quenching of the optical wavelength conversion member 13 can be prevented. Therefore, a reduction in fluorescence intensity can be prevented as compared with the case where the support member 23 is not used.

In the second embodiment, the optical wavelength conversion component 15 is fixed through thermal press fitting of the optical wavelength conversion member 13 into the through hole 25 of the quadrangular-frame-shaped support member 23. Thus, the optical wavelength conversion member 13 can be reliably supported by the support member, and advantageously exhibits high durability.

[2-4. Modifications]

Modifications of the second embodiment are as follows. For example, as illustrated in FIG. 5A, a support member 31 may be formed of a quadrangular frame body 33 and a surface plate 35 which partially covers an upper portion (upward in FIG. 5A) of a space (through hole) defined by the frame body 33. The surface plate 35 has an opening 37 at the center thereof. An optical wavelength conversion member 39 is disposed inside (downward in FIG. 5A) of the surface plate 35.

Thus, light whose wavelength has been converted by means of the optical wavelength conversion member 39 is emitted through the opening 37 to the outside (upward in FIG. 5A). The opening 37, which has a size smaller than the inner size of the frame 33, exhibits the effect of reducing the amount of emitted light.

As illustrated in FIG. 5B, an optical wavelength conversion member 45 may be disposed in an opening 43 of a support member 41 having an L-shaped vertical section as in the support member 31 shown in FIG. 5A, and a light-emitting element 47 may be disposed below the optical wavelength conversion member 45.

As illustrated in FIG. 5C, an optical wavelength conversion member 55 and a light-emitting element 57 may be disposed so as to be laminated with each other in an opening 53 of a support member 51 which is in the form of, for example, plate.

As illustrated in FIG. 5D, a through hole 63 of a support member 61 may be provided such that the inner diameter of the through hole 63 on an opening end 63a side (i.e., a light-emitting side) decreases in a direction of press fitting (i.e., downward in FIG. 5D) of an optical wavelength conversion member 65. With this configuration, the optical wavelength conversion member 65 is readily press-fitted into the through hole, and the optical wavelength conversion member 65 is reliably fixed to the support member. Thus, the resultant optical wavelength conversion component advantageously exhibits improved durability.

[3. Examples]

The present invention will next be described in detail by way of Examples.

Among the below-described Examples, Examples 1 to 6 correspond to the first embodiment, and Example 7 corresponds to the second embodiment.

Example 1

Ceramic sintered body (i.e., optical wavelength conversion member) samples (Nos. 1 to 4 and 29) were prepared under the conditions shown in TABLE 1. Samples Nos. 1 to 3 fall within the scope of the present invention, and samples Nos. 4 and 29 fall outside the scope of the present invention (Comparative Examples).

Specifically, for preparation of each sample, $Al_2O_3$ powder (mean particle size: 0.3 μm), $Y_2O_3$ powder (mean particle size: 1.2 μm), and $CeO_2$ powder (mean particle size: 1.5 μm) were weighed so that the amount of YAG ($Y_3Al_5O_{12}$) was 30 vol. % in a ceramic sintered body (i.e., a ceramic sintered body forming an optical wavelength conversion member) and the Ce content was 1 mol % relative to Y in YAG as shown in TABLE 1.

These powders were added to a ball mill together with an organic solvent and a specific amount of a dispersant (2 wt. % in terms of solid content, relative to the raw material powders), and these materials were grind-mixed for 12 hours.

The powder prepared through grind-mixing was mixed a polyvinyl butyral resin, to thereby prepare a slurry. The slurry was then formed into a sheet compact by means of doctor blading.

Subsequently, the sheet compact was degreased, and then fired in a specific firing atmosphere shown in TABLE 1 at 1,450° C. to 1,750° C. for 3 to 20 hours. This firing process is so-called atmosphere-controlled firing.

Thus, ceramic sintered body samples Nos. 1 to 4 and 29 were prepared. Each ceramic sintered body had a plate form (a rectangular parallelepiped shape) and dimensions of 20 mm×20 mm×0.8 mm (thickness).

Examples of the usable dispersant include polycarboxylate dispersants, such as SN Dispersant 5468 (product of San Nopco Limited) and MALIALIM AKM-0531 (product of NOF Corporation).

Subsequently, the prepared ceramic sintered bodies were examined for the following properties (a) to (d) in the same manner as in other examples described below. The results are shown in TABLE 1.

In TABLE 1, "$O_2$%:23," "$O_2$%:16," "$O_2$%:0.8," "$O_2$%:0," "$O_2$%:20," "$O_2$%:5," "$O_2$%:10," or "$O_2$%:25" respectively represents an atmosphere of Ar (carrier gas) and oxygen (concentration: 23%, 16%, 0.8%, 0%, 20%, 5%, 10%, or 25%), wherein the symbol refers to vol. %.

(a) Relative Density

The relative density of each ceramic sintered body was measured by the Archimedes method, and the measured density was converted into a relative density.

(b) Fluorescence Intensity

The main surface of each ceramic sintered body was ground for reducing the thickness of the sintered body, to thereby prepare a sample having dimensions of 20 mm×20 mm×0.5 mm (thickness). Thus, the main surface of the plate-like sintered body was ground to thereby expose a cross section (i.e., a sample surface).

Blue LD light (wavelength: 465 nm) was focused to a width of 0.3 mm by means of a lens, and the sample surface was irradiated with the focused light. The light transmitting through the sample was focused by means of a lens, and the emission intensity (i.e., fluorescence intensity) was measured by means of a power sensor.

The sample surface was irradiated with the light at a center portion (i.e., the center of gravity in plan view) and a corner portion (a region within 1 mm (in X-Y coordinate) from the circumference). As used herein, the term "center portion" refers to a position at the center of gravity in plan view (the intersection point of median lines or diagonal lines in the case of a square or a rectangle), and the term "corner portion" refers to a region within 1 mm (width) from orthogonal peripheral sides in plan view.

The sample was irradiated with the light at a power density of 40 W/mm. The emission intensity was evaluated by a value relative to that (taken as 100) of a YAG:Ce single-crystal body.

(c) Color Unevenness (Variation in Color)

Color unevenness was evaluated through determination of a variation in chromaticity by means of an illuminometer.

Specifically, each sample was processed into a shape of 20 mm×20 mm×0.5 mm (thickness). Blue LD light (wavelength: 462 nm) was focused to a width of 0.4 mm by means of a lens, and the sample surface was irradiated with the focused light. A color illuminometer was used to determine the chromaticity of the light transmitting through the surface of the sample opposite the surface irradiated with the focused light.

The light irradiation was performed on a 18 mm square region (at intervals of 3 mm in the region) at the center of the irradiation surface of the sample (sample surface), and a variation in chromaticity (in X-direction) (i.e., color unevenness: ΔX) was evaluated. As used herein, the term "color unevenness (ΔX)" refers to the maximum deviation of chromaticity (in X-direction).

The term "chromaticity" as used herein refers to a chromaticity indicated by the CIE-XYZ color system established by the International Commission on Illumination (CIE) in 1931. Specifically, the chromaticity is indicated by the xy chromaticity diagram (so-called CIE chromaticity diagram), wherein three primary colors of light are digitized and represented in an xy coordinate space.

The above-determined fluorescence intensity and color unevenness of each sample can be evaluated on the basis of the following criteria. Samples of other examples can be evaluated in the same manner.

The fluorescence intensity is preferably more than 110 at a center portion and a corner portion. The color unevenness ΔX is preferably less than 0.025.

(d) C/Al Relative Concentration Ratio

C/Al relative concentration ratio (i.e., the ratio of the number of atoms:atm %) was determined through analysis by means of XPS (X-ray photoelectron spectroscopy).

Specifically, each sample was processed into a shape of 20 mm×20 mm×0.5 mm (thickness), and the analysis was performed at a cross section of the sample (main surface) at a center portion (center of gravity) and a corner portion (a region within 1 mm (in X-Y coordinate) from the circumference) in plan view.

The ratio of the number of C atoms (Cin) to the number of Al atoms (Alin) (i.e., inside ratio (Cin/Alin)) was determined at a center portion of each sample, and the ratio of the number of C atoms (Cout) to the number of Al atoms (About) (i.e., outside ratio (Cout/About)) was determined at a corner portion (i.e., end portion) of the sample. The thus-determined inside ratio and outside ratio were used to determine a relative concentration ratio (Cout/Alout)/(Cin/Alin) (i.e., outside ratio/inside ratio).

The conditions for measurement are as follows: X-ray beam diameter: 100 μmφ, signal acquisition angle: 45°, and pass energy: 140.0 eV.

The relative concentration ratio is evaluated as follows. Specifically, the relative concentration ratio (Cout/Alout)/(Cin/Alin) is preferably less than 2.

Next will be described the results of evaluation of the samples of Example 1 on the basis of the aforementioned criteria.

All the samples of Example 1 exhibited a relative density of 99% or more; i.e., the samples were sufficiently densified.

As shown in TABLE 1, samples Nos. 1 to 3, which were prepared through firing in a firing atmosphere having an oxygen concentration of 0.8 vol. % or more and less than 25 vol. %, exhibited good results in terms of fluorescence intensity and color unevenness.

Sample No. 4, which was prepared through firing in a firing atmosphere having a lower oxygen concentration, exhibited low fluorescence intensity and a large difference in fluorescence intensity between the center portion and the corner portion of the sample as compared with the case of samples Nos. 1 to 3. In addition, sample No. 4 exhibited large color unevenness.

Sample No. 29, which was prepared through firing in a firing atmosphere having a higher oxygen concentration, exhibited low fluorescence intensity.

Samples Nos. 1 to 3, which showed a relative concentration ratio (hereinafter referred to as "relative C/Al" in, for example, TABLE 1) of 2 or less, exhibited high fluorescence intensity and small color unevenness.

In contrast, sample No. 4, which showed a relative C/Al of more than 2, exhibited low fluorescence intensity and large color unevenness.

Example 2

As shown in TABLE 1, ceramic sintered body samples (samples Nos. 5 to 8) were prepared and evaluated in the same manner as in Example 1. Samples Nos. 5 and 6 fall within the scope of the present invention, and samples Nos. 7 and 8 fall outside the scope of the present invention (Comparative Examples).

The proportions of the raw materials were changed so that the Ce content was adjusted to 0.3 mol % relative to Y of $A_3B_5O_{12}$ (YAG) in the ceramic sintered body.

The firing was performed in a specific furnace atmosphere prepared through purging with an atmosphere gas containing Ar (carrier gas) and oxygen (concentration: 20 vol. %).

All the samples exhibited a relative density of 99% or more; i.e., the samples were sufficiently densified.

Samples Nos. 5 and 6, which were prepared through firing in a firing atmosphere having a pressure of $10^4$ Pa or more, exhibited good results in terms of fluorescence intensity and color unevenness.

In contrast, sample No. 7, which was prepared through firing in a firing atmosphere having a pressure of less than $10^4$ Pa, exhibited blackening at a center portion of the sample and low emission intensity. Again, fluorescence intensity was low. Sample No. 8 showed a considerable reduction in weight by burning and failed to be evaluated.

Example 3

As shown in TABLE 1, ceramic sintered body samples (samples Nos. 9 to 13) were prepared and evaluated in the same manner as in Example 1.

The proportions of the raw materials were changed so that the amount of $A_3B_5O_{12}$:Ce (amount of YAG:Ce) in the ceramic sintered body was adjusted to 2 to 79 vol. %.

The firing was performed in a specific furnace atmosphere prepared through purging with an atmosphere gas containing Ar (carrier gas) and oxygen (concentration: 5 vol. %).

All the samples exhibited a relative density of 99% or more; i.e., the samples were sufficiently densified.

Samples Nos. 10 to 12, in which the YAG:Ce content fell within a specific range (i.e., 3 to 70 vol. %), exhibited good results in terms of fluorescence intensity and color unevenness.

In contrast, sample No. 9, in which the YAG:Ce content was lower, exhibited low fluorescence intensity.

Sample No. 13, in which the YAG:Ce content was higher, exhibited high fluorescence intensity at its center portion but low fluorescence intensity at its corner portion, and exhibited large color unevenness.

Example 4

As shown in TABLE 1, ceramic sintered body samples (samples Nos. 14 to 20) were prepared and evaluated in the same manner as in Example 1.

$Y_2O_3$ powder was used in combination with at least one of $Lu_2O_3$ powder (mean particle size: 1.3 µm), $Yb_2O_3$ powder (mean particle size: 1.5 µm), $Gd_2O_3$ powder (mean particle size: 1.5 µm), $Tb_2O_3$ powder (mean particle size: 1.6 µm), and $Ga_2O_3$ powder (mean particle size: 1.3 µm). During mixing of the raw materials, the proportions of the raw materials were varied so that specific $A_3B_5O_{12}$:Ce was synthesized.

The firing was performed in a specific furnace atmosphere prepared through purging with an atmosphere gas containing Ar (carrier gas) and oxygen (concentration: 10 vol. %).

All the samples exhibited a relative density of 99% or more; i.e., the samples were sufficiently densified.

All the samples exhibited good results in terms of fluorescence intensity and color unevenness.

Example 5

As shown in TABLE 1, ceramic sintered body samples (samples Nos. 21 to 26) were prepared and evaluated in the same manner as in Example 1. Samples Nos. 22 to 26 fall within the scope of the present invention, and sample No. 21 falls outside the scope of the present invention (Comparative Example).

The proportions of the raw materials were changed so that the Ce content was adjusted to 0 to 10 mol; relative to Y of $A_3B_5O_{12}$ (YAG) in the ceramic sintered body.

The firing was performed in an air atmosphere.

All the samples exhibited a relative density of 99% or more; i.e., the samples were sufficiently densified.

Samples Nos. 22 to 25, in which the Ce content fell within a specific range (i.e., more than 0 mol % and 5 mol % or less), exhibited good results in terms of fluorescence intensity and color unevenness.

In contrast, sample No. 21 (containing no Ce) failed to be evaluated in terms of fluorescence intensity and color unevenness.

Sample No. 26 (having higher Ce content) exhibited color unevenness falling within a reference range but exhibited low fluorescence intensity.

Example 6

As shown in TABLE 1, ceramic sintered body samples (samples Nos. 27 and 2$) were prepared and evaluated in the same manner as in Example 1.

Sample No. 28 was prepared by mixing $Al_2O_3$ powder (mean particle size: 0.3 µm) with $A_3B_5O_{12}$ (YAG) powder having a Ce content of 0.3 mol % relative to Y in $A_3B_5O_{12}$ (YAG). The firing was performed in an atmosphere of a gas mixture of $H_2$ and $N_2$ (=45:55 (by volume)). The atmosphere gas was moistened by means of a wetter at a water temperature of 25° C.

Sample No. 27 exhibited a relative density of 99% or more; i.e., the sample was sufficiently densified. Sample No. 28 exhibited a relative density of about 94%.

Sample No. 27 exhibited good results in terms of fluorescence intensity and color unevenness. Sample No. 28 exhibited color unevenness falling within a reference range but exhibited low fluorescence intensity.

TABLE 1

| Sample No. | Firing atmosphere Pressure [Pa] | $O_2$ [vol %] | $Al_2O_3$ content [vol %] | $A_3B_5O_{12}$:Ce [vol %] | $A_3B_5O_{12}$ composition | Ce content [mol %] | Relative C/Al < 2 | Fluorescence intensity Center > 110 | Fluorescence intensity Corner > 110 | Color unevenness $\Delta$x < 0.025 |
|---|---|---|---|---|---|---|---|---|---|---|
| 1 | 1.000E+05 | 23 | 70 | 30 | YAG | 1 | 1.0 | 112 | 111 | 0.016 |
| 2 | ↑ | 16 | 70 | 30 | YAG | 1 | 1.0 | 125 | 125 | 0.009 |
| 3 | ↑ | 0.8 | 70 | 30 | YAG | 1 | 1.5 | 122 | 111 | 0.014 |
| 4 | ↑ | 0 | 70 | 30 | YAG | 1 | 2.3 | 60 | 46 | 0.026 |
| 5 | 8.600E+04 | 20 | 70 | 30 | YAG | 0.3 | 1.4 | 134 | 122 | 0.018 |
| 6 | 2.000E+04 | ↑ | 70 | 30 | YAG | 0.3 | 1.3 | 122 | 111 | 0.023 |
| 7 | 5.000E+02 | ↑ | 70 | 30 | YAG | 0.3 | 1.8 | 63 | 52 | 0.021 |
| 8 | 3.000E−03 | ↑ | 70 | 30 | YAG | 0.3 | Not evaluated | Not evaluated | Not evaluated | Not evaluated |
| 9 | 1.000E+05 | 5 | 98 | 2 | YAG | 0.3 | 1.5 | 90 | 89 | 0.026 |
| 10 | ↑ | ↑ | 97 | 3 | YAG | 0.3 | 1.4 | 112 | 110 | 0.024 |
| 11 | ↑ | ↑ | 43 | 57 | YAG | 0.3 | 1.3 | 122 | 114 | 0.018 |
| 12 | ↑ | ↑ | 30 | 70 | YAG | 0.3 | 1.4 | 117 | 113 | 0.021 |
| 13 | ↑ | ↑ | 21 | 79 | YAG | 0.3 | 2.2 | 113 | 103 | 0.027 |
| 14 | 1.000E+05 | 10 | 70 | 30 | $Lu_3Al_5O_{12}$ | 3 | 1.0 | 120 | 120 | 0.006 |
| 15 | ↑ | ↑ | 70 | 30 | $Y_{1.5}Lu_{1.5}Al_5O_{12}$ | 3 | 1.1 | 119 | 120 | 0.007 |
| 16 | ↑ | ↑ | 70 | 30 | $Yb_3Al_5O_{12}$ | 3 | 1.0 | 117 | 116 | 0.005 |
| 17 | ↑ | ↑ | 70 | 30 | $Y_{1.5}Gd_{1.5}Al_5O_{12}$ | 3 | 1.0 | 118 | 117 | 0.005 |
| 18 | ↑ | ↑ | 70 | 30 | $Y_{1.5}Yb_{1.5}Al_5O_{12}$ | 3 | 1.1 | 120 | 119 | 0.006 |
| 19 | ↑ | ↑ | 70 | 30 | $Y_{1.5}Tb_{1.5}Al_5O_{12}$ | 3 | 1.0 | 119 | 120 | 0.006 |
| 20 | ↑ | ↑ | 70 | 30 | $Y_3Al_4Ga_1O_{12}$ | 3 | 1.0 | 120 | 118 | 0.007 |
| 21 | 1.013E+05 | 20 | 70 | 30 | YAG | 0 | 1.2 | Not evaluated | Not evaluated | Not evaluated |
| 22 | ↑ | ↑ | 70 | 30 | YAG | 0.005 | 1.0 | 136 | 126 | 0.014 |
| 23 | ↑ | ↑ | 70 | 30 | YAG | 0.1 | 1.1 | 135 | 124 | 0.011 |
| 24 | ↑ | ↑ | 70 | 30 | YAG | 0.5 | 1.0 | 130 | 121 | 0.008 |
| 25 | ↑ | ↑ | 70 | 30 | YAG | 5 | 1.0 | 110 | 107 | 0.013 |
| 26 | ↑ | ↑ | 70 | 30 | YAG | 10 | 1.8 | 90 | 82 | 0.024 |
| 27 | 1.013E+05 | $H_2$ + $N_2$ wetter | 75 | 25 | YAG | 0.3 | 1.1 | 137 | 136 | 0.005 |
| 28 | ↑ | ↑ | 75 | 25 | YAG (Powder mixing) | 0.3 | 1.2 | 68 | 66 | 0.020 |
| 29 | 1.000E+05 | 25 | 75 | 25 | YAG | 0.3 | 1.2 | 32 | 32 | 0.018 |

As is well known. "αE±β" (wherein α and β represent numerals) in the column "Pressure" of TABLE 1 refers to "α×10$^{±β}$." For example, "1.0E+05" refers to "1.0×10$^5$."

Example 7

A sintered body prepared in the same manner as in Example 5 was processed into a shape of 10 mm×10 mm×0.2 mm (thickness), to thereby prepare a first optical wavelength conversion member (i.e., sample No. 30).

Similarly, the sintered body was processed into a shape of 1.5 mm×1.5 mm×0.2 mm (thickness), to thereby prepare a second optical wavelength conversion member.

The second optical wavelength conversion member was press-fitted into a through hole (i.e., an opening) of an aluminum-made frame (i.e., a support member) having outer dimensions of 20 mm×20 mm×0.2 mm (thickness), to thereby prepare sample No. 31 (i.e., an optical wavelength conversion component) (see FIG. 6). The shape and dimensions of the opening are the same as those of the second optical wavelength conversion member.

The optical wavelength conversion member of each of samples Nos. 30 and 31 was irradiated with laser light in almost the same manner as in the aforementioned fluorescence intensity determination of Examples 1 to 6, to thereby determine the state of temperature quenching.

Specifically, blue LD light (wavelength: 465 nm) was focused to a width of 0.3 mm by means of a lens, and the surface of the optical wavelength conversion member of each sample was irradiated with the focused light. The light transmitting through the optical wavelength conversion member was focused by means of a lens, and the fluorescence intensity was measured by means of a power sensor.

In particular, in Example 7, the optical wavelength conversion member was irradiated with laser light at a specific power density until occurrence of quenching in association with temperature increase (i.e., occurrence of temperature quenching). Specifically, the power density for laser light irradiation was gradually increased from 40 W/mm$^2$ in increments of, for example, 1 W/mm$^2$, to thereby determine the states of temperature quenching corresponding to different power densities. The maximum power density was 60 W/mm$^2$.

In sample No. 30, the temperature quenching of the optical wavelength conversion member occurred at a power density of laser light of 47 N/mm$^2$.

In contrast, in sample No. 31, the temperature quenching of the optical wavelength conversion member, which was supported by the metal-made frame, did not occur even at a power density of laser light of 60 W/mm$^2$.

4. Other Embodiments

Needless to say, the present invention is not limited to the aforementioned embodiments, but may be implemented in various other forms without departing from the scope of the invention.

(1) For example, the present invention may involve any firing process performed in a firing atmosphere satisfying the conditions of the invention; i.e., a firing atmosphere having a pressure of 10$^4$ Pa or more and an oxygen concentration of 0.8 vol. % or more and less than 25 vol. %.

(2) The aforementioned optical wavelength conversion member or light-emitting device can be used for various applications, including fluorescent bodies, optical wavelength conversion apparatuses, head lamps, lighting apparatuses, and optical apparatuses (e.g., projectors).

(3) The optical wavelength conversion component for supporting the optical wavelength conversion member may have any configuration besides that described in the second embodiment.

For example, as illustrated in FIG. 7A, an optical wavelength conversion member 73 may be supported by a pair of metal-made support members 71 through sandwiching of the member 73 between the members 71. Alternatively, as illustrated in FIG. 7B, an optical wavelength conversion member 85 may be supported by a metal-made columnar support member 81 through fitting of the member 85 into a groove 83 provided in a side of the member 81.

(4) In each of the aforementioned embodiments, the function of a single component may be shared by a plurality of components, or a single component may exert the functions of a plurality of components. Some of the components in each of the aforementioned embodiments may be omitted. At least some of the components in each of the aforementioned embodiments may be, for example, added to or replaced with components in another embodiment. Embodiments of the present invention encompass any form included in technical ideas specified by the appended claims.

DESCRIPTION OF REFERENCE NUMERALS

1: light-emitting device; 5, 17, 47, 57: light-emitting element; 9, 13, 39, 45, 55, 65, 73, 85: optical wavelength conversion member; 15: optical wavelength conversion component; and 23, 31, 41, 51, 61, 71, 81: support member

The invention claimed is:

1. An optical wavelength conversion member comprising a sintered body containing, as main components, $Al_2O_3$ and a component represented by formula $A_3B_5O_{12}$:Ce (wherein A and B are elements), the optical wavelength conversion member being characterized in that:
the sintered body exhibits a relative concentration ratio (Cout/Alout)/(Cin/Alin) of 1.0 to 2, wherein (Cin/Alin) represents the ratio of the number of C atoms (Cin) to the number of Al atoms (Alin) in a cross section at a center portion of the sintered body, and (Cout/Alout) represents the ratio of the number of C atoms (Cout) to the number of Al atoms (About) in a cross section at an end portion of the sintered body.

2. An optical wavelength conversion component, characterized by comprising an optical wavelength conversion member as recited in claim 1, and a support member which is made of a metal and supports the optical wavelength conversion member, wherein the support member has a thermal conductivity higher than the thermal conductivity of the optical wavelength conversion member.

3. An optical wavelength conversion component according to claim 2, wherein the support member is formed of a frame body, and the optical wavelength conversion member is fixed in the frame body.

4. A method for producing the optical wavelength conversion member according to claim 1, the method being characterized by comprising:
producing the sintered body through firing in a firing atmosphere having a pressure of 10$^4$ Pa or more and an oxygen concentration of 0.8 vol. % or more and less than 25 vol. %.

5. A method for producing an optical wavelength conversion member according to claim 4, wherein the sintered body has an $A_3B_5O_{12}$:Ce content of 3 to 70 vol. %, and the $A_3B_5O_{12}$:Ce is composed of polycrystalline grains formed through eutectic segregation in $Al_2O_3$ during the firing.

6. A method for producing an optical wavelength conversion member according to claim 4, wherein the sintered body has a garnet structure represented by $A_3B_5O_{12}$:Ce, wherein each of A and B is at least one element selected from the following element groups:

A: Sc, Y, and lanthanoids (except for Ce), and

B: Al and Ga.

7. A method for producing an optical wavelength conversion member according to claim 4, wherein the Ce content of the $A_3B_5O_{12}$:Ce is 5 mol % or less (exclusive of 0) relative to the element A.

8. A light-emitting device, characterized by comprising an optical wavelength conversion member as recited in claim 1.

9. A light-emitting device, characterized by comprising an optical wavelength conversion component as recited in claim 2.

10. A light-emitting device, characterized by comprising an optical wavelength conversion component as recited in claim 3.

\* \* \* \* \*